US010294560B2

(12) United States Patent
Rudolph et al.

(10) Patent No.: US 10,294,560 B2
(45) Date of Patent: May 21, 2019

(54) HIGH-CONDUCTANCE, NON-SEALING THROTTLE VALVE WITH PROJECTIONS AND STOP SURFACES

(71) Applicant: Lam Research Corporation, Fremont, CA (US)

(72) Inventors: Dirk Rudolph, Dundee, OR (US); Antonio Xavier, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1009 days.

(21) Appl. No.: 14/016,720

(22) Filed: Sep. 3, 2013

(65) Prior Publication Data

US 2015/0059648 A1 Mar. 5, 2015

(51) Int. Cl.

*C23C 14/56* (2006.01)
*C23C 16/44* (2006.01)
*F16K 51/00* (2006.01)

(52) U.S. Cl.

CPC .......... *C23C 14/56* (2013.01); *C23C 16/4412* (2013.01); *F16K 51/00* (2013.01); *Y10T 137/86863* (2015.04)

(58) Field of Classification Search

USPC .............. 251/305, 309; 118/715; 156/345.33
See application file for complete search history.

(56) References Cited

U.S. PATENT DOCUMENTS 3,267,920 A * 8/1966 Pagenstecher ........ F01N 13/085 123/1 R
4,253,641 A * 3/1981 VanRyck ...................... 251/306
6,722,335 B2 * 4/2004 Nomura .................. F02B 27/02 123/184.36
2002/0036065 A1 * 3/2002 Yamagishi et al. ........... 156/345
2004/0055565 A1 * 3/2004 Yamamoto .............. F02B 27/02 123/337
2007/0240677 A1 * 10/2007 Sasaki ........................... 123/337
2012/0055402 A1 * 3/2012 Moriya ............... C23C 16/4402 118/724

* cited by examiner

*Primary Examiner* — Rudy Zervigon

(57) ABSTRACT

A throttle valve includes a throttle body including a housing having an inner surface. The throttle body includes first and second stop surfaces arranged on the inner surface. A throttle plate is rotatable inside the housing of the throttle body about a shaft between closed and open positions. A first projection is located on a first surface of the throttle plate adjacent to a radially outer end of the throttle plate. A second projection is located on a second surface of the throttle plate adjacent to a radially outer end of the throttle plate. The second surface is opposite the first surface. The first and second projections extend outwardly from the throttle plate in opposite directions and in corresponding directions of rotational movement of the throttle plate during closing to bias against the second stop surface when the throttle valve is closed.

16 Claims, 5 Drawing Sheets

HIGH-CONDUCTANCE, NON-SEALING THROTTLE VALVE WITH PROJECTIONS AND STOP SURFACES

FIELD

The present disclosure relates to throttle valves, and more particularly throttle valves used to deliver precursor in substrate processing systems depositing film.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Substrate processing system implementing atomic layer deposition (ALD) and chemical vapor deposition (CVD) may be used to deposit film on a substrate such as a semiconductor wafer. Some types of ALD may involve dosing a processing chamber with a first precursor for a predetermined period to allow the first precursor to adsorb onto the surface of the substrate. After the predetermined period, the process chamber is purged using valves and vacuum pumps. Then, a second precursor may be introduced and/or activation may be performed. Another purge may be performed. Each ALD cycle deposits a thin layer of film. Typically, the ALD cycle is repeated multiple times to achieve a desired film thickness. In contrast, some CVD involves exposing the substrate to first and second precursors at the same time to create the film on the surface of the substrate.

Throughput is an important characteristic of any substrate processing system. Therefore, the amount of time that is needed to deposit the desired thickness of the film is an important metric when evaluating a tool. Additional considerations include downtime that will be required to maintain the tool. As can be appreciated, valve cycle time and maintenance may impact throughput.

Valves may be used to deliver and purge the precursors and purge gas to/from the process chamber. While gate valves or similar active sealing valves may be used for this application, the maximum life cycle of these valves may be reached in an unacceptably short amount of time due to the high cycle count. The valves tend to fail due to the wear of the seal, which is typically made of a polymer material.

Low-conductance, non-sealing throttle valves have also been used. The throttle valves use either a flat metal-on-metal surface or a seal ring type low-conductance position. Over time, process byproduct builds up on the valves, which increases leakage across the throttle valve. Furthermore, the process needs to be stopped frequently to allow valve openings to be cleaned. Both of these throttle valve types struggle to meet high cycle requirements and tool availability demands presented by ALD or CFD applications.

SUMMARY

A throttle valve includes a throttle body including a housing having an inner surface. The throttle body includes first and second stop surfaces arranged on the inner surface. A shaft rotates about an axis and is rotatable relative to the housing. A throttle plate is rotatable inside the housing of the throttle body about the shaft between a closed position and an open position. A first projection is located on a first surface of the throttle plate adjacent to a radially outer end of the throttle plate. The first projection extends outwardly from the throttle plate in a direction of rotational movement of the throttle plate during closing to bias against the first stop surface when the throttle valve is closed. A second projection is located on a second surface of the throttle plate adjacent to a radially outer end of the throttle plate. The second surface is opposite the first surface. The second projection extends outwardly from the throttle plate in a direction of rotational movement of the throttle plate during closing to bias against the second stop surface when the throttle valve is closed.

In other features, the first projection and the second projection have a triangular cross-section. The first stop surface and the second stop surface have a triangular cross section. The first projection and the second projection extend approximately 160° to 180° in a circumferential manner around the first surface and the second surface of the throttle plate. The first stop surface and the second stop surface extend approximately 160° to 180° in a circumferential manner around the inner surface of the housing. The first projection and the second projection are rotationally offset on the first and second surface of the throttle plate by approximately 180°.

In other features, the first stop surface and the second stop surface are rotationally offset by approximately 180° on the inner surface of the housing. The first and second stop surfaces are spaced in an axial direction of the housing by a distance that is approximately equal to a thickness of the throttle plate, a height of the first projection and a height of the second projection.

A throttle valve assembly comprises a first throttle valve and a second throttle valve in accordance with the throttle valve. A first actuator is configured to adjust a position of the first throttle valve. A second actuator is configured to adjust a position of the second throttle valve. A conduit includes an inlet, a first outlet connected to the first throttle valve, and a second outlet connected to the second throttle valve.

A substrate processing system includes a process chamber and the throttle valve assembly. The inlet of the conduit communicates with the process chamber. A first vacuum pump is connected to the first outlet of the conduit. A second vacuum pump is connected to the second outlet of the conduit.

In other features, the substrate processing system performs one of atomic layer deposition (ALD) and chemical vapor deposition (CVD).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

The present disclosure relates to a throttle valve for a substrate processing system. The throttle valve includes one or more projections arranged on a throttle plate. In some examples, the projections have a pointed or knife-like edge. Mating surfaces are provided on a housing of a throttle body. As will be described further below, the projections and the stop surfaces extend a service cycle of the throttle valve. The projections and stop surfaces increase surface contact pressure of the throttle plate. This allows the throttle valve to cut through process debris during operation. As a result, the throttle valve will continue to perform in a lowest conductance region while closed despite the buildup of process debris during use.

Use of the projections and stop surfaces significantly improves the ability of the throttle valve to deal with the process byproducts present in a vacuum line of the process chamber. High contact pressure combined with torque of an actuator controlling a throttle plate cuts through the process debris that coats inner walls of the process vacuum tubes, particularly in ALD and CFD applications. Using a seal formed by the projections and the stop surfaces will extend the service cycle and improve tool availability.

Figure 1:
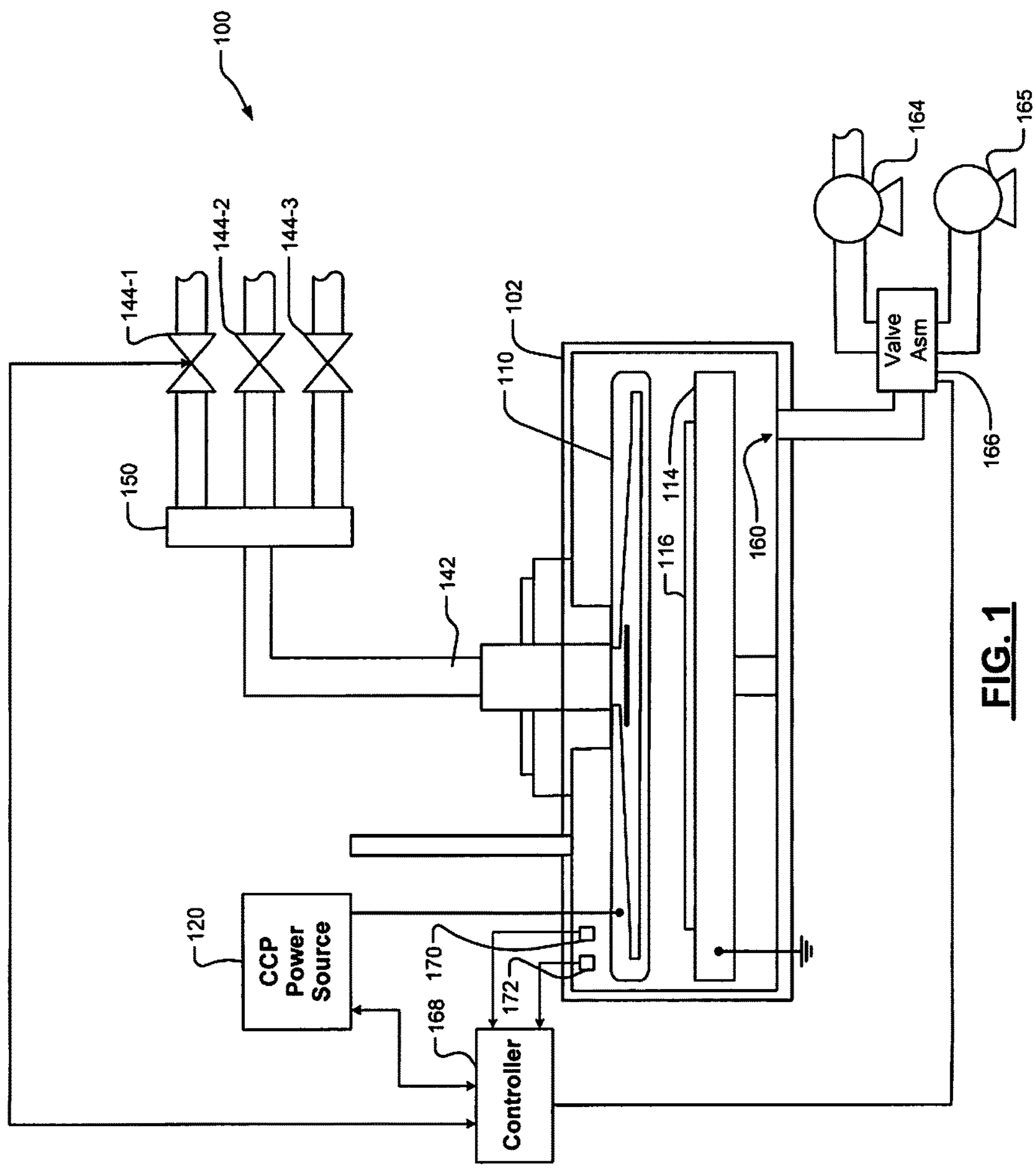
FIG. 1 is a functional block diagram of an example of a substrate processing system including a throttle valve assembly with one or more throttle valves according to the present disclosure.

FIG. 1 shows an example of a substrate processing system 100 for performing ALD or CVD. The substrate processing system 100 includes a process chamber 102. The substrate processing system 100 further includes a showerhead 110 to deliver process gases to the process chamber 102. While a showerhead 110 is shown, other delivery methods may be used.

A pedestal 114 may be connected to a reference potential such as ground. Alternatively an electrostatic chuck (ESC) may be used instead of the pedestal. The pedestal 114 may include a chuck, a fork, or lift pins (all not shown) to hold and transfer a substrate 116 during and between deposition and/or plasma treatment reactions. The chuck may be an electrostatic chuck, a mechanical chuck or various other types of chuck.

For example only, if plasma is used, a capacitively coupled plasma (CCP) power source 120 may be used to supply RF power across the showerhead 110 and the pedestal 114 to create plasma. As can be appreciated, while the pedestal 114 is shown to be grounded, the RF power may be supplied to the pedestal 114 and the showerhead may be grounded. In some examples, a remote plasma source (not shown) may provide remotely generated plasma to the process chamber 102 at one or more RF power levels. In other examples, an inductively coupled plasma power source (not shown) may be used to supply current to a coil. When a time-varying current passes through the coil, the coil creates a time-varying magnetic field. The magnetic field induces current in gas in the process chamber, which leads to the formation of plasma in the process chamber.

The process gases are introduced to the showerhead 110 via inlet 142. Multiple process gas lines are connected to a manifold 150. The process gases may be premixed or not. Appropriate valves and mass flow controllers (generally identified at 144-1, 144-2, and 144-3) are employed to ensure that the correct gases and flow rates are used during substrate processing. Process gases exit the process chamber 102 via an outlet 160.

Two or more vacuum pumps 164 and 165 draw process gases out of the process chamber 102. A valve assembly 166 includes two or more throttle valves that control a direction that the process gases flow relative to vacuum pumps 164 and 165. The direction that the valve assembly 166 selects may be based on compatibility of the current chemistry relative to other chemistry being pumped from the process chamber. A controller 168 may sense operating parameters such as chamber pressure and temperature inside the process chamber using sensors 170 and 172. The controller 168 may control the valve assembly 166 and valves and mass flow controllers 144. The controller 168 may also control the CCP power source 120.

Figure 2:
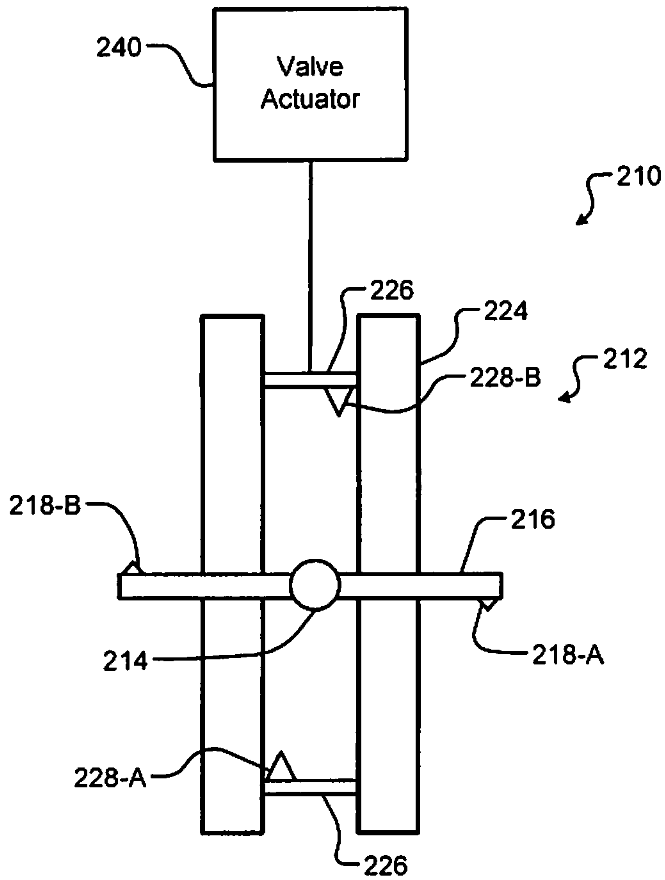
FIG. 2 is a side cross-sectional view illustrating an example of a throttle valve in an open position according to the present disclosure.
Figure 3B:
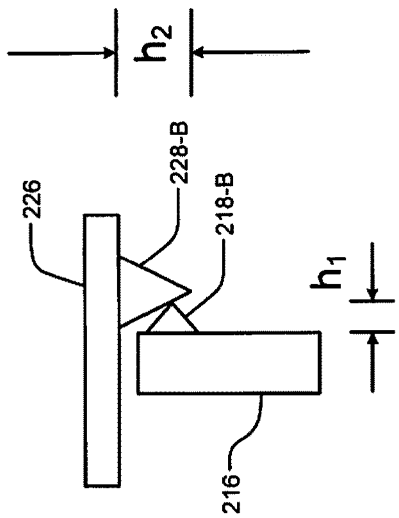
FIGS. 3A and 3B are side cross-sectional views illustrating an example of a throttle valve in a closed position according to the present disclosure.
Figure 3A:
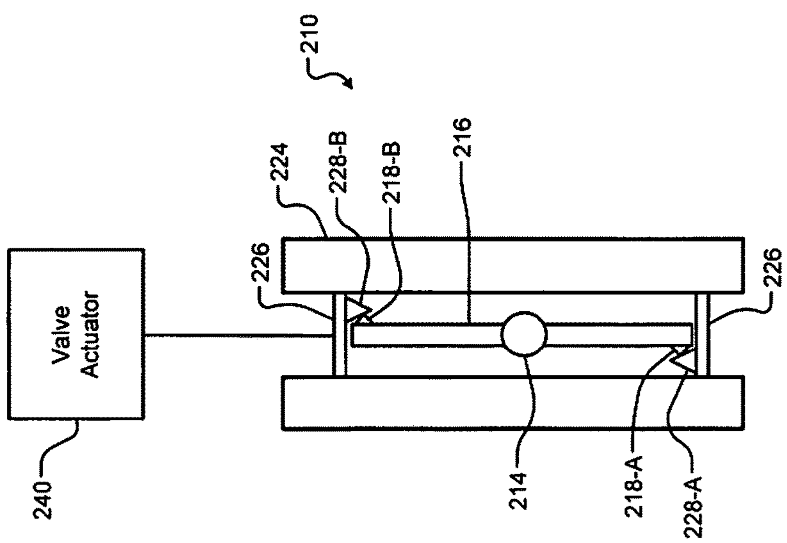

FIG. 2 shows an example of a throttle valve 210 in an open position according to the present disclosure. FIGS. 3A and 3B show an example of a throttle valve 210 in a closed position according to the present disclosure. The throttle valve 210 includes a throttle body 212 and a throttle plate 216 that rotates on a shaft 214 about an axis within the throttle body 212.

Radially outer ends of the throttle plate 216 include projections 218-A and 218-B (collectively projections 218). The projections 218-A and 218-B project or extend in opposite directions from the throttle plate 216. The projection 218-A may be arranged on one surface of the throttle plate 216 and the projection 218-B may be arranged on an opposite surface of the throttle plate 216. The projection 218-A may extend approximately 180° in a circumferential manner around the radially outer edge of the throttle plate 216. The projection 218-B may also extend approximately 160° to 180° in a circumferential manner around the radially outer edge of the opposite side of the throttle plate 216. The projections may be offset from each other by 180° relative to the throttle plate 216. The projections 218 may have a sharp leading edge to facilitate piercing of debris. The projections 218 may extend in a direction of movement of the throttle plate during closing. Each of the projections 218 may have one end adjacent to one end of the shaft 214 and another end adjacent to the other end of the shaft 214.

The throttle body 212 of the throttle valve 210 includes a housing 226 including stop surfaces 228-A and 228-B (collectively stop surfaces) arranged on an inner surface of the housing 226. The stop surfaces 228 may include projections that may have a similar cross section as the projections 218 (e.g. triangular) or another cross-section such as rectangular, rhombus, square, etc. For example only, the housing 226 may have a circular cross section. The stop surfaces 228-A and 228-B extend radially inwardly from an inner surface of the housing 226. The stop surface 228-A may extend approximately 160° to 180° in a circumferential manner around the inner surface of the housing 226. The stop surface 228-B may also extend approximately 160° to 180° in a circumferential manner around the inner surface of the housing 226. Each of the stop surfaces 228 may have one end adjacent to one end of the shaft 214 and another end adjacent to the other end of the shaft 214. The stop surface 228 may be offset from each other by approximately 180° relative to the throttle plate 216. A valve actuator 240 rotates the throttle plate 216 relative to the housing between an open position (FIG. 2) and a closed position (FIG. 3A).

The stop surfaces 228-A and 228-B may be spaced (in an axial direction relative to the inner surface) by a distance that is approximately equal to a thickness of the throttle plate 216, a height of the projection 218-A and a height of the projection 218-B.

As can be seen in FIGS. 3A and 3B, the projection 218-B on the throttle plate 216 is biased against the stop surface 228-B on the housing 226. In some examples, the projection 218-B is biased against a side of the stop surface 228-B. In some examples, a line perpendicular to a surface of the throttle plate 216 forms an obtuse angle with respect to a side of the stop surface 228 (when the projection 218-B is biased against the side of the stop surface 228-B). In FIG. 3B, the projection 218-B has a height $h_1$ and the stop surface has a height $h_2$.

Figure 4:
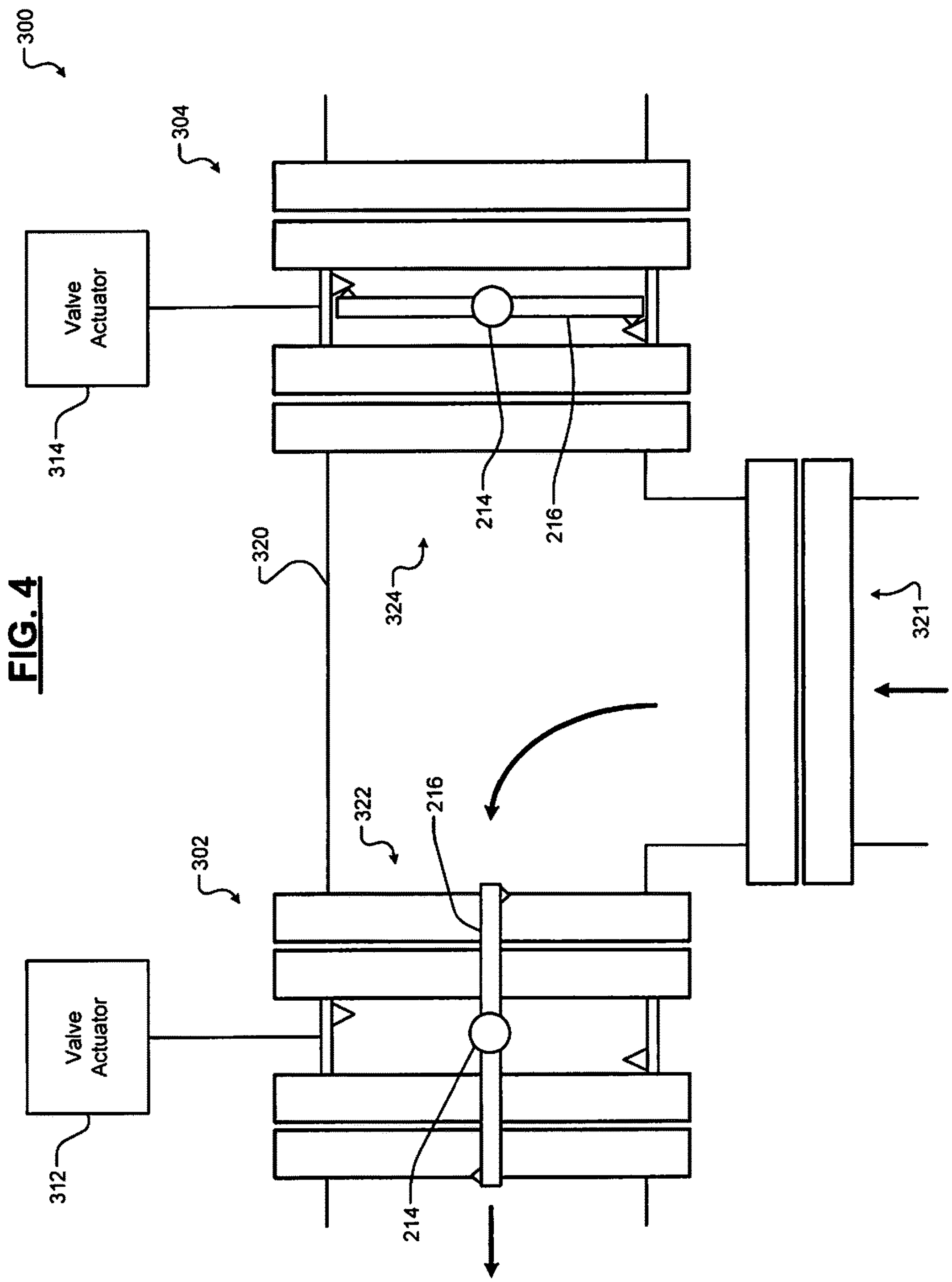
FIGS. 4 and 5 are side cross-sectional views illustrating examples of throttle valve assemblies according to the present disclosure.
Figure 5:
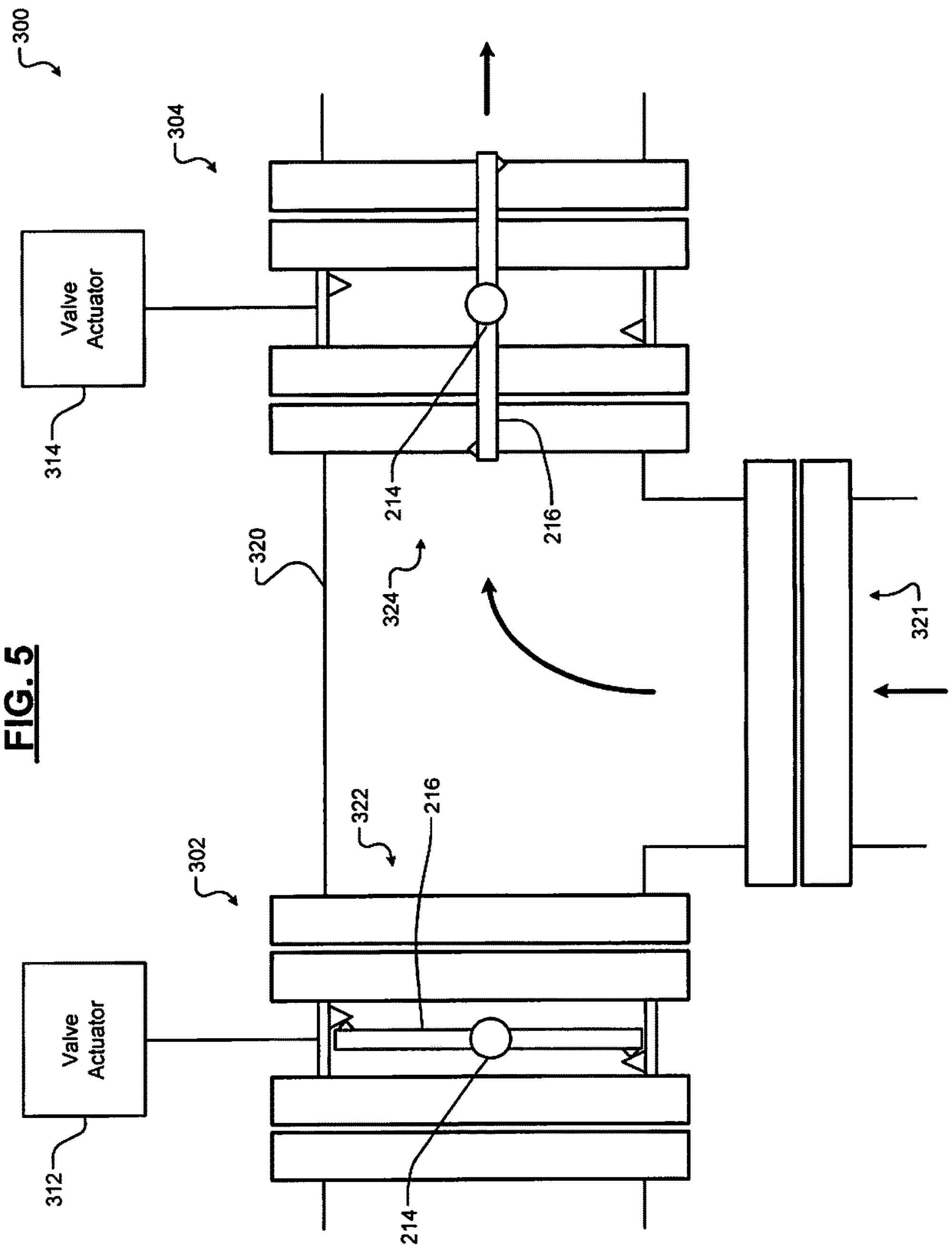

FIGS. 4 and 5 show an example of a throttle valve assembly 300 including first and second throttle valves 302 and 304 that include actuators 312 and 314, respectively. The actuators 312 and 314 may include a motor that communicates with the controller 168. A conduit 320 receives gas at an inlet 321 and is connected to inlets 322 and 324 of the throttle valves 302 and 304, respectively. In some examples the conduit 320 is generally "T"-shaped, although other shapes can be used. In FIG. 4, the throttle plate 216 of the throttle valve 302 is located in a closed position and the throttle plate 216 of the throttle valve 304 is located in an open position. In FIG. 5, the throttle plate 216 of the throttle valve 302 is located in an open position and the throttle plate 216 of the throttle valve 304 is located in a closed position.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

What is claimed is:

1. A throttle valve, comprising:

a throttle body including a housing having an inner surface, wherein the throttle body includes first and second stop surfaces arranged on the inner surface;

a shaft that rotates about an axis and that is rotatable relative to the housing;

a throttle plate rotatable inside the housing of the throttle body about the shaft between a closed position and an open position and that includes:

a first projection located on a first surface of the throttle plate adjacent to a radially outer end of the throttle plate, wherein the first projection has a triangular cross-section, extends outwardly from the first surface of the throttle plate to form a first point in a first direction that is perpendicular to the first surface of the throttle plate, and contacts the first stop surface when the throttle valve is closed; and a second projection located on a second surface of the throttle plate adjacent to a radially outer end of the throttle plate, wherein the second surface is opposite the first surface and, when the throttle plate is in the closed position, the first and second surfaces are perpendicular to a flow direction through the housing, and wherein the second projection has a triangular cross-section, extends outwardly from the second surface of the throttle plate to form a second point in a second direction that is perpendicular to the second surface of the throttle plate, and contacts the second stop surface when the throttle valve is closed.

2. The throttle valve of claim 1, wherein the first stop surface and the second stop surface have a triangular cross-section.

3. The throttle valve of claim 1, wherein the first projection and the second projection extend approximately 160° to 180° in a circumferential manner around the first surface and the second surface of the throttle plate.

4. The throttle valve of claim 1, wherein the first stop surface and the second stop surface extend approximately 160° to 180° in a circumferential manner around the inner surface of the housing.

5. The throttle valve of claim 1, wherein the first projection and the second projection are rotationally offset on the first and second surfaces of the throttle plate by approximately 180°.

6. The throttle valve of claim 1, wherein the first stop surface and the second stop surface are rotationally offset by approximately 180° on the inner surface of the housing.

7. The throttle valve of claim 1, wherein the first and second stop surfaces are spaced in an axial direction of the housing by a distance that is approximately equal to a thickness of the throttle plate, a height of the first projection and a height of the second projection.

8. A throttle valve assembly comprising:

a first throttle valve and a second throttle valve in accordance with the throttle valve of claim 1;

a first actuator configured to adjust a position of the first throttle valve;

a second actuator configured to adjust a position of the second throttle valve; and a conduit including an inlet, a first outlet connected to the first throttle valve, and a second outlet connected to the second throttle valve.

9. A substrate processing system, comprising:

a process chamber;

the throttle valve assembly of claim 8, wherein the inlet of the conduit communicates with the process chamber;

a first vacuum pump connected to the first outlet of the conduit; and a second vacuum pump connected to the second outlet of the conduit.

10. The substrate processing system of claim 9, wherein the substrate processing system performs one of atomic layer deposition (ALD) and chemical vapor deposition (CVD).

11. A substrate processing system, comprising:

a process chamber having an outlet;

a gas delivery system that delivers a first precursor gas into the process chamber during a first period to deposit film on a substrate located within the process chamber;

a throttle valve that is connected to the outlet of the process chamber and that includes a throttle plate having projections, wherein the projections are configured to, during closing of the throttle valve, cut through debris coating an inner surface of the throttle valve due to buildup of the first precursor gas; and a vacuum pump that removes reactants from the process chamber through the throttle valve.

12. The substrate processing system of claim 11 wherein the gas delivery system further delivers a second precursor gas into the process chamber during a second period to deposit film on the substrate, wherein the second precursor gas is incompatible with the first precursor gas.

13. The substrate processing system of claim 12 further comprising:

a second throttle valve that is connected to the outlet of the process chamber and that includes a second throttle plate having second projections configured to, during closing of the second throttle valve, cut through debris coating a second inner surface of the second throttle valve due to buildup of the second precursor gas;

a second vacuum pump that removes reactants from the process chamber through the second throttle valve; and a controller that, based on whether the first precursor gas or the second precursor gas is being delivered to the process chamber, one of:

opens the throttle valve and operates the vacuum pump; and opens the second throttle valve and operates the second vacuum pump.

14. The substrate processing system of claim 11 wherein the projections have triangular cross-sections.

15. The substrate processing system of claim 11 wherein:

the projections are located on first and second surfaces of the throttle plate adjacent to outer ends of the throttle plate, the first and second surfaces are perpendicular to the inner surface of the throttle valve when the throttle plate is in a closed position, and the projections extend outwardly from the first and second surfaces of the throttle plate to points in directions that are perpendicular to the first and second surfaces.

16. A non-sealing throttle valve, comprising:

a throttle body including a housing having an inner surface, wherein the throttle body includes first and second stop surfaces arranged on the inner surface, the first and second stop surfaces having triangular cross-sections;

a shaft that rotates about an axis and that is rotatable relative to the housing;

a throttle plate rotatable inside the housing of the throttle body about the shaft between a closed position and an open position and that includes:

a first projection that has a triangular cross-section to cut through debris on the inner surface and that is located on a first surface of the throttle plate adjacent to a radially outer end of the throttle plate, wherein the first projection extends outwardly from the first surface of the throttle plate in a first direction that is perpendicular to the first surface and contacts the first stop surface when the throttle valve is closed; and a second projection that has a triangular cross-section to cut through debris on the inner surface and that is located on a second surface of the throttle plate adjacent to a radially outer end of the throttle plate, wherein the second surface is opposite the first surface and, when the throttle plate is in the closed position, the first and second surfaces are perpendicular to a flow direction through the housing, and wherein the second projection extends outwardly from the second surface of the throttle plate in a second direction that is perpendicular to the second surface and that contacts the second stop surface when the throttle valve is closed.

* * * * *